United States Patent
Skotnicki et al.

(10) Patent No.: US 6,727,186 B1
(45) Date of Patent: Apr. 27, 2004

(54) METHOD FOR LATERAL ETCHING WITH HOLES FOR MAKING SEMICONDUCTOR DEVICES

(75) Inventors: Thomas Skotnicki, Crolles (FR); Malgorzata Jurczak, Grenoble (FR)

(73) Assignee: France Télécom, Paris (FR)

( * ) Notice: Subject to any disclaimer, the term of this patent is extended or adjusted under 35 U.S.C. 154(b) by 77 days.

(21) Appl. No.: 10/019,340

(22) PCT Filed: Jun. 27, 2000

(86) PCT No.: PCT/FR00/01796
§ 371 (c)(1),
(2), (4) Date: Apr. 15, 2002

(87) PCT Pub. No.: WO01/01477
PCT Pub. Date: Jan. 4, 2001

(30) Foreign Application Priority Data

Jun. 28, 1999 (FR) .............................. 99 08248

(51) Int. Cl.⁷ .............................................. H01L 21/00
(52) U.S. Cl. ...................... 438/734; 438/719; 438/739; 438/740; 438/752; 438/753
(58) Field of Search ................................ 438/719, 734, 438/737, 739, 740, 752, 753

(56) References Cited

U.S. PATENT DOCUMENTS 5,153,813 A * 10/1992 Oehrlein et al. ......... 438/739 X
5,622,882 A * 4/1997 Yee ......................... 438/739 X
5,714,401 A * 2/1998 Kim et al. ............... 438/739 X

FOREIGN PATENT DOCUMENTS

JP 06 120490 4/1994

OTHER PUBLICATIONS

M. Jurczak et al: "SON (Silicon On Nothing)–A New Device Architecture for the ULSI Era" 1999 Symposium on VLSI Technology Digest of Technical Papers (IEEE CAT. No. 99CH36325), Proceedings from the 1999 Symposium on VLSI Technology, Kyoto, Japan, Jun. 14–16, 1999, pp. 29–30, XP002133376, 1999, Tokyo, Japan, Japan Soc. Appl. Phys, Japan ISBN: 4–930813–93–X.

"MOS Transistors with Bottom–Isolated Source/Drain Regions" Research Disclosure, GB, Industrial Opportunities Ltd. Havant, No. 398, Jun. 1, 1997, pp. 378–379, XP000726504, ISSN: 0374–4353.

* cited by examiner

Primary Examiner—William A. Powell
(74) Attorney, Agent, or Firm—Meyertons, Hood, Kivlin, Kowert & Goetzel, P.C.; Eric B. Meyertons

(57) ABSTRACT

A method of fabricating an SON structure semiconductor device is described. There is formed, on a silicon substrate, a stack of layers comprising first and second successive combinations. Each successive combination has a bottom silicon-germanium alloy (Site) layer and a top silicon layer. In a conventional way, a gate dielectric layer, a gate, spacers, source and drain regions, and an external passivating layer are formed by ionic implantation. A vertical hole is formed in the gate as far as the bottom Site layer to etch a part of the Site layers to form tunnels. The walls of the hole and the tunnels are then internally passivated so that the tunnels can remain empty or be filled.

21 Claims, 4 Drawing Sheets

METHOD FOR LATERAL ETCHING WITH HOLES FOR MAKING SEMICONDUCTOR DEVICES

BACKGROUND OF THE INVENTION

1. Field of the Invention

The present invention relates to a method of lateral etching via holes for fabricating semiconductor devices. It finds a beneficial application in high performance CMOS semiconductor devices for fast signal processing and/or low-voltage/low-power applications, and more particularly in MOS field-effect transistors (MOSFET).

2. Description of the Related Art

One limiting factor of standard massive architecture MOSFETs is the substrate effect which degrades the performance of the transistor. This drawback is avoided in silicon on insulator (SOI) architecture MOSFETs by separating the thin film of silicon from the substrate by a buried layer of silicon oxide.

Eliminating the substrate effect in thin-film SOI architecture MOSFETs that are totally depleted increases the drain current.

However, ultrathin SOI architecture MOSFETs have a high source/drain (S/D) resistance because of shallow junctions limited by the thickness of the silicon layer and poor thermal conductivity. The cost of fabricating SOI architecture substrates is also high, which has restricted their entry into the market.

Silicon on nothing (SON) architecture semiconductor devices combining the advantages of the solid and silicon on insulation (SOI) architectures have been proposed to remedy the drawbacks of the above SOI or solid architecture devices. These semiconductor devices, such as an MOS field-effect transistor, feature extremely thin silicon films and buried oxides, i.e., a thickness on the order of a few nanometers.

FIG. 1 shows a SON architecture device of the above kind in which the buried dielectric layer is limited to the area underlying the gate region of the device.

Referring to FIG. 1, the semiconductor device comprises a silicon substrate 1. having a top surface coated with a thin gate dielectric layer 4 in which are formed source and drain regions 5 and 6. Source and drain regions 5 and 6 define between them a channel region 1a of predetermined minimum length and a gate 7 on the top surface of the body over the channel region 1a. The device further includes a continuous or discontinuous insulative cavity 2 in the channel region 1a between the source and drain regions 5 and 6. The insulating cavity 2 delimits, in conjunction with the source and drain regions 5 and 6, a thin silicon layer 3 from 1 nm to 50 nm thick overlying the insulative cavity 2. The insulative cavity has a length representing at least 70% of the predetermined minimum length of the channel region 1a. The gate 7 is flanked by spacers 8 and 9. Contacts 10, 11 are provided on the source and drain regions 5, 6.

The terms "cavity" and "tunnel" are used interchangeably hereinafter.

In the device described above the expression "predetermined minimum length" of the channel region refers to the shortest channel length which can be used in a device of a given technology.

The insulative cavity can consist of any appropriate solid or gaseous dielectric material but is preferably a cavity filled with air.

A method of fabricating a semiconductor device may include:

forming, on a top surface of a silicon substrate 1, a layer of a material which can be selectively eliminated and which preferably ensures lattice continuity with the silicon substrate 1;

forming, on the layer of material which can be selectively eliminated, a thin silicon layer 3 from 1 nm to 50 nm thick which also preferably ensures lattice continuity with the material that can be selectively eliminated and consequently with the silicon substrate;

forming a thin gate dielectric layer 4 on the thin silicon layer 3;

forming a gate 7 on the thin gate dielectric layer 4;

etching the thin gate dielectric layer 4, the thin silicon layer 3, the layer of material that can be selectively eliminated, and an upper part of the substrate 1 along two opposite sides of the gate 7 to form voids;

partly or totally selectively laterally etching the layer of material that can be selectively eliminated to form a continuous cavity 2 or a discontinuous cavity, filled with air, the total length of which represents at least 70% of a predetermined minimum length of the channel region;

optionally, filling the cavity 2 or the cavities with a solid dielectric material; and filling the voids with silicon and doping them to form the source and drain regions 5 and 6.

The source and drain regions 5 and 6 are preferably formed by epitaxial growth of silicon followed by ion implantation of dopants. Implantation is advantageously followed by annealing to activate the dopants implanted in the source and drain regions 5 and 6 selectively. The annealing is carried out for a short time period at a high temperature.

However, in the fabrication method described above, creating the cavity 2 after forming the gate 7 and before forming the source and drain regions 5 and 6 has drawbacks if the cavity 2 is to be left filled with air. This is because activating (annealing) the source and drain regions 5 and 6 exposes the cavity 2 to high temperatures. Exposing cavities filled with air to high annealing temperatures can degrade the cavities.

Forming a cavity filled with air after activating the source and drain regions 5 and 6 may reduce the drawbacks of filling a cavity with air.

SUMMARY OF THE INVENTION

A method of fabricating a silicon on nothing (SON) structure semiconductor device in which the cavity filled with air has not been exposed to high temperatures during the step of activating the source and drain regions is described.

A method of fabricating an SON structure semiconductor device may include:

forming, on a main surface of a silicon substrate, a stack of layers including at least one combination of two layers having a bottom layer of germanium, or germanium and silicon alloy, and a top layer of silicon. If it has more than one combination of two layers, the stack of layers may include a first combination immediately adjacent the substrate and a final combination farthest away from the substrate;

forming, on the top silicon layer of the combination or the last combination of the stack, a thin gate dielectric layer and a gate;

forming source and drain regions along two opposite sides of the gate in the thin gate dielectric layer and in the stack;

etching at least one hole in the stack at least as far as the bottom germanium (or germanium and silicon alloy) layer of the combination or the first combination of the stack;

selectively laterally etching via the hole at least a part of the germanium (or germanium and silicon alloy) layer or layers of the stack to form a tunnel or tunnels under the gate; and optionally internally passivating or filling the tunnel or tunnels with a dielectric material.

In other words, the source and drain regions are formed first while the germanium (or germanium and silicon alloy) layers that can be selectively eliminated are present. It is only after forming the source and drain regions that the material which can be selectively eliminated is etched, via the hole, to form the tunnel(s) (i.e., a cavity or cavities filled with air).

In one embodiment, the hole is etched by forming at least one vertical hole through the gate, the thin gate dielectric layer and the stack 15, and under the gate as far as the bottom germanium or germanium and silicon alloy layer of the first combination. It will be clear to the skilled person that several holes can be formed through the gate if the dimensions of the gate allow this.

In another embodiment, at least two vertical holes are etched through the source and drain regions as far as the germanium or germanium and silicon alloy layer of the first combination. As before, it will be clear to the skilled person that several holes can be formed in each region if the dimensions of the source and drain regions allow this. This variant can be used to fabricate devices requiring a gate with small dimensions. Etching holes in the gate is more suitable for devices such as sensors in which the gate can have large dimensions.

The source and drain regions can generally be formed by implanting dopants which diffuse under a part of the gate.

Spacers can be formed on two opposite lateral sides of the gate after forming it, in the conventional way. Forming such spacers is well known to the skilled person.

The source and drain regions can be formed in the conventional way by creating voids in the stack and extending as far as the substrate along two opposite sides of the gate, filling the voids with epitaxially grown silicon and then implanting dopants. However, the source and drain regions are preferably formed by implanting dopants in the stack and as far as the substrate after forming the gate (flanked with spacers) and without creating voids.

Dopants are implanted so that, by lateral diffusion, the doped areas (the source and drain regions) underlie the spacers and a portion of the gate.

The hole(s) to be used for lateral etching of the germanium or germanium and silicon alloy layer(s) can be made by a conventional etching process, for example, anisotropic plasma etching.

The germanium or SiGe alloy layers can be selectively laterally etched via one or more holes using a conventional process such as plasma etching or selective chemical etching using an oxidizing solution, which is well known in the art.

The selective lateral etching of the germanium or germanium and silicon alloy layer(s) via a hole is preferably controlled to form a tunnel or tunnels extending under the spacers. For example, the etching may be controlled by adjusting the parameters of the etching process, in particular the selective lateral etching temperature and time.

Before etching the hole, the entire device is preferably covered with a layer of passivating material.

BRIEF DESCRIPTION OF THE DRAWINGS

Other advantages and features of the invention will become apparent after reading the following detailed description of one non-limiting embodiment of the invention and examining the accompanying drawings, in which.

DETAILED DESCRIPTION OF THE PREFERRED EMBODIMENTS

The method of fabricating a SON structure MOSFET incorporating two tunnels filled with air will now be described, although this is not limiting on the invention.

Figure 1:
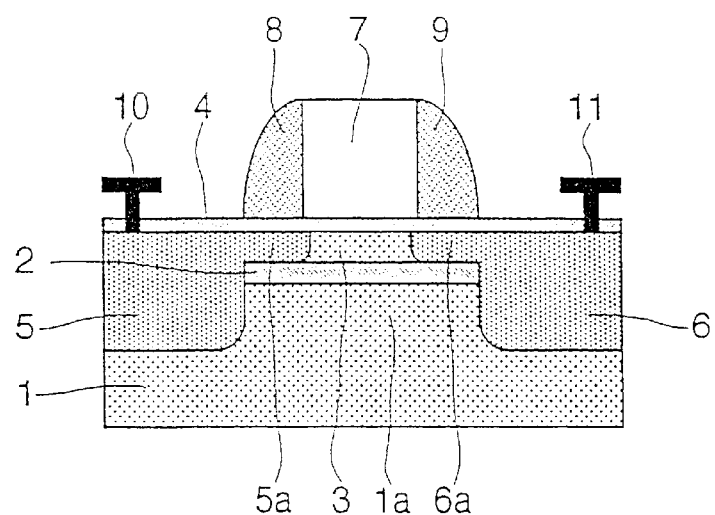
FIG. 1 is a diagrammatic sectional view of a SON architecture device in which the buried dielectric layer is limited to the area underlying the gate region of the device.
Figure 2:
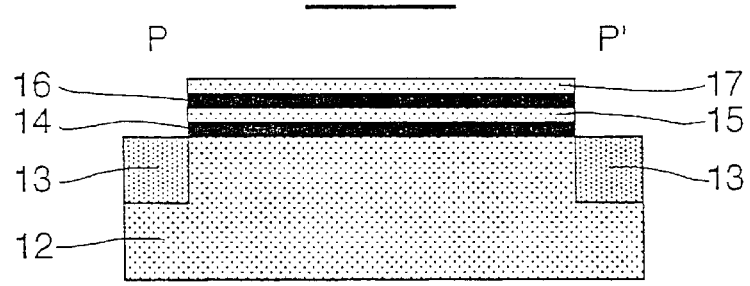
FIGS. 2 and 3 are diagrammatic sectional views showing the main steps of a method of fabricating a device before etching the holes.

FIG. 2 shows a silicon substrate 12 whose upper part is surrounded by a rectangular section cylindrical insulative box 13. On the upper surface of the silicon substrate 12, delimited by the insulative box 13, a first combination is formed consisting of a bottom layer 14 of silicon and germanium alloy, SiGe, and a top layer 15 of silicon. There is then formed on top of the first combination, a second combination also made up of a bottom layer 16 of SiGe and a top layer 17 of silicon.

The silicon layers 15, 17 and the SiGe layers 14, 16 of the two combinations are formed by selective epitaxial growth to ensure continuity of the lattice of the substrate from the silicon substrate 12 to the consecutive silicon layers 15, 17 and silicon-germanium alloy layers 14, 16. The stack formed in this way covers all of the top surface of the silicon substrate 12.

Figure 3:
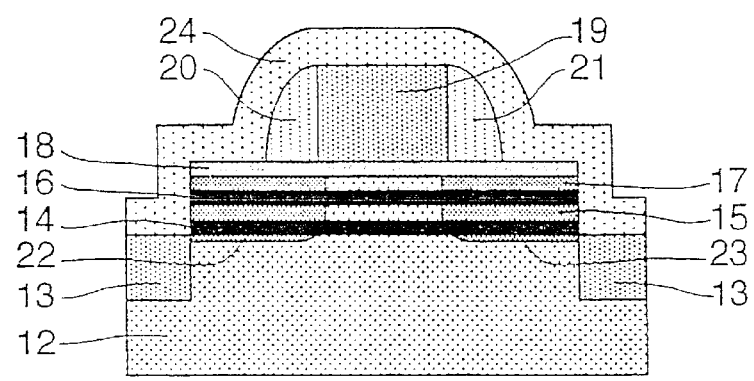

As shown in FIG. 3, and in a manner that is conventional for producing a MOSFET, a thin gate dielectric layer 18, usually of silicon dioxide, is grown on the top silicon layer 17 of the second combination. The thin silicon dioxide layer 18 does not cover the insulative box 13 on two main lateral sides P and P' of the stack consisting of the layers 14, 15, 16 and 17. On the other hand, the thin silicon dioxide layer 18 extends as far as the insulative box 13 on the two secondary lateral sides of the stack. In FIG. 2, the two secondary lateral sides are perpendicular to the two main lateral sides P and P', i.e., perpendicular to the section plane.

A polycrystalline silicon gate 19 is then formed on a central part of the thin gate dielectric layer 18 along the main lateral sides P and P' and the full length of the thin gate dielectric layer 18 along the two secondary lateral sides as far as two sides of the insulative box 13. The gate 19 is flanked by spacers 20, 21 made of silicon nitride, Si3N4 (for example, on the two main lateral sides P and P').

The source and drain regions 22, 23 are obtained by implanting dopants along the spacers 20, 21 in the silicon dioxide layer 18, the silicon layers 15, 17 and the silicon-germanium alloy layers 14, 16 of the two combinations, and, optionally, in an upper part of the silicon substrate 12. The source and drain regions diffuse laterally towards each other under the spacers without joining up. The region 12a under the gate which the diffused dopants do not reach is an active area. This active area 12a comprises the stacked layers 14, 15, 16 and 17, all of which are undoped.

The dopants are implanted in two steps:
- a first step in which the target regions are bombarded with dopant ions; and
- a second step, following on from the first and referred to as annealing or activating the source and drain regions, in which the device is annealed to enable crystalline rearrangement of the implanted regions and render the dopants electrically active (ions). The annealing is carried out for a short time period at a high temperature of at most 850° C.

The upper part of the device is then covered with a layer 24 of a passivating material such as silicon dioxide. This is well known to the skilled person.

Figure 4A:
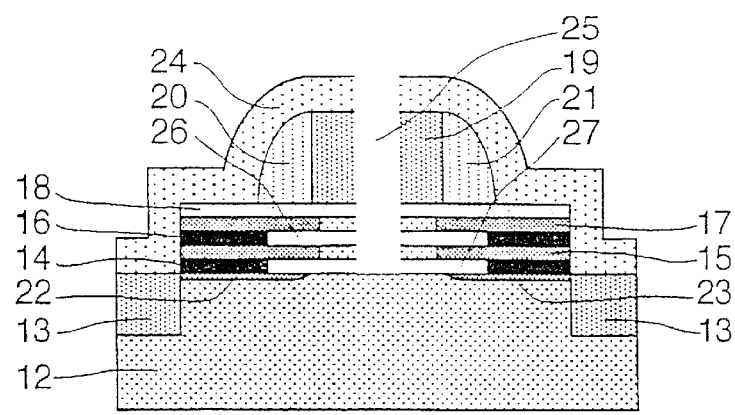
FIGS. 4a, 4b and 4c are diagrammatic sectional views of the main steps of one embodiment of a method of fabricating a device with at least one hole through the gate.

As shown in FIG. 4a, a vertical hole 25 is then formed through the silicon dioxide layer 24, the polycrystalline silicon layer 19 forming the gate, the silicon dioxide layer 18 and the active area (i.e., the silicon layers 15, 17 and the silicon-germanium alloy layers 14, 16 of the two combinations, as far as an upper portion of the silicon substrate 12). The hole 25 can be formed by anisotropic plasma etching.

Tunnels 26 and 27 are then selectively laterally etched via the hole 25 in the respective silicon germanium alloy layers 16 and 14 and this etching extends laterally under the spacers.

Figure 4B:
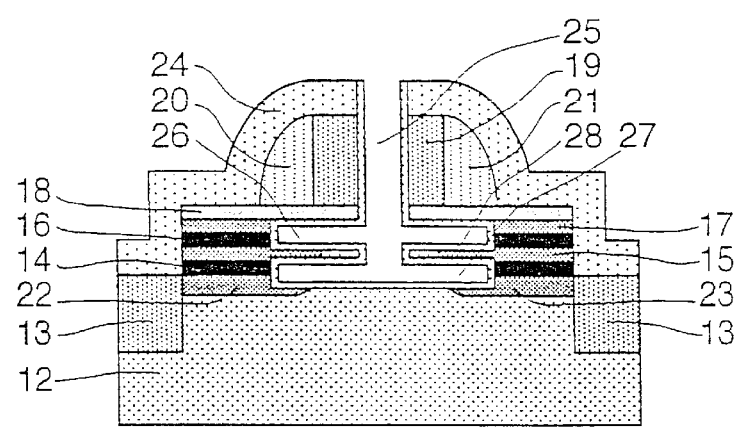

As shown in FIG. 4b, the hole 25 and the tunnels 26 and 27 are internally passivated by thermal oxidation. In other words, a thin silicon dioxide layer is formed on the walls of the hole 25 and the tunnels 26 and 27. The part of the layer of silicon 15 that is not doped in the active area constitutes the channel 29 of the transistor. The channel 29 is a layer in which the hole 25 is found. The thickness of the silicon layer is preferably such that growing the thin gate dielectric layer 18 and internally passivating the hole 25 and the tunnels 26 and 27 entirely consumes the silicon layer 17 at the level of the tunnel 26. The thicknesses of the silicon-germanium alloy layers 14, 16 and the silicon dioxide 28 (internal passivating material) are such that the hole 25 and the tunnels 26, 27 are not blocked. However, they can be blocked with the silicon dioxide 28 if necessary.

Figure 4C:
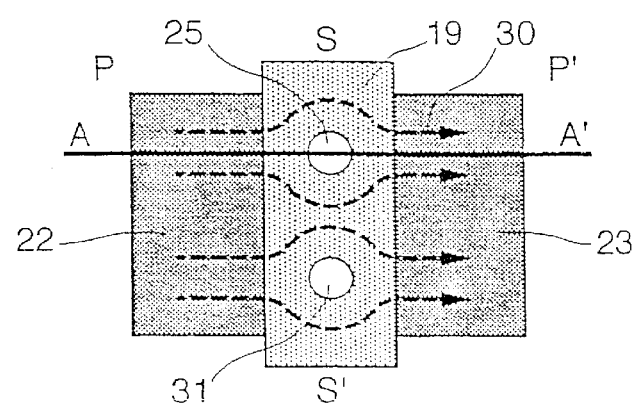

FIG. 4c shows a transistor in which two holes 25 and 31 are formed in the gate 19. The hole 31 is obtained in the same way as the hole 25 by creating tunnels and internal passivation. To simplify the diagram the external passivation layer 10 (silicon dioxide 24), the insulative box 13, and the spacers 20, 21 are not shown. FIGS. 4a and 4b are sections taken in a section plane in the direction A—A', as shown in FIG. 4c. FIG. 4c also shows current lines 30 leaving the source region 22 and directed towards the drain region 23 via the channel 29. FIG. 4c also shows the two main lateral sides P and P' and the two secondary lateral sides S and S'.

Figure 5:
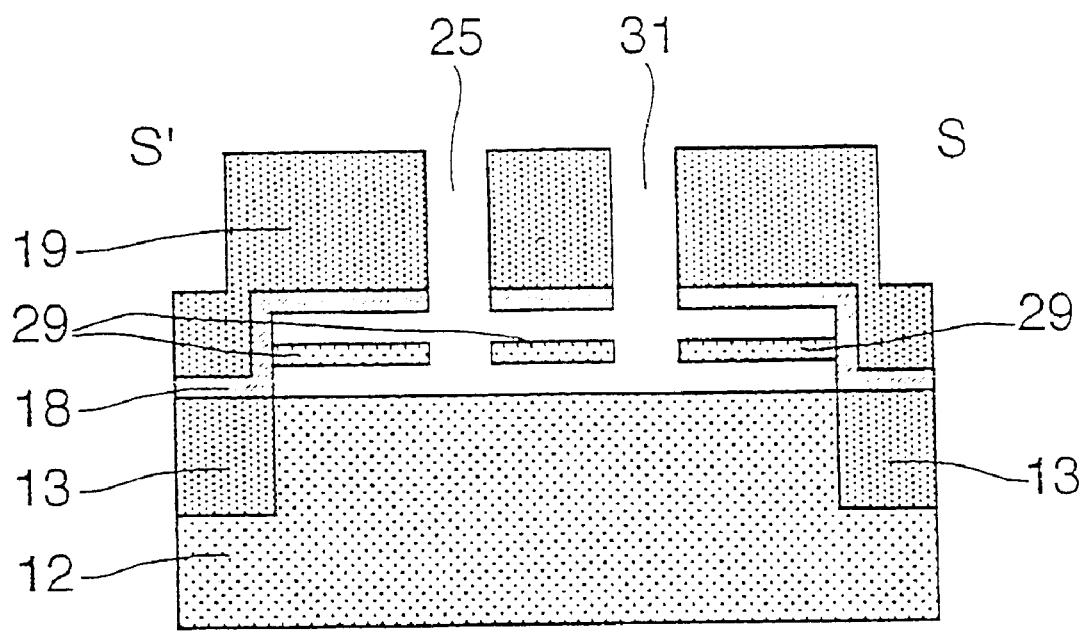
FIG. 5 is a simplified sectional view of a device made by the method as shown in FIGS. 4a–4c but with two holes etched in the gate.

FIG. 5 is a simplified sectional view of a device obtained by the method shown in FIGS. 4a–4c, in which the passivating layers (24, 28) are omitted. The section plane is in a direction S—S' passing through the holes 25 and 31 (FIG. 4c).

Figure 6A:
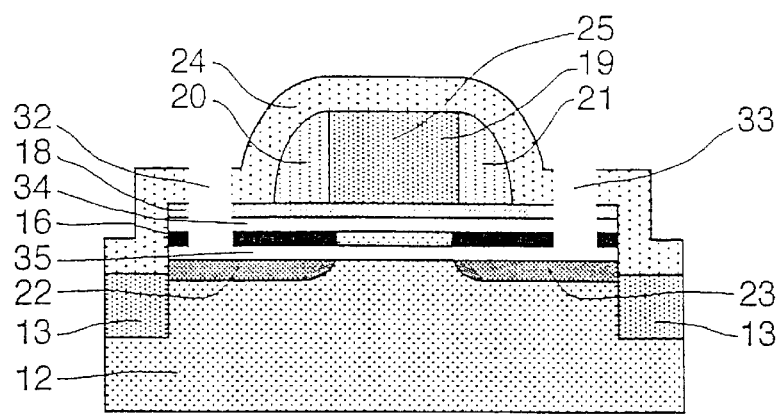
FIGS. 6a, 6b and 6c are diagrammatic sectional views of the main steps of another embodiment of a method of fabricating a device with holes through the source and drain regions.
Figure 6B:
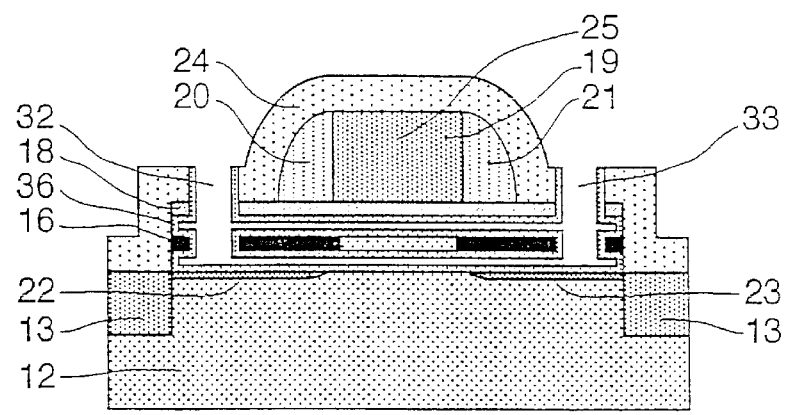
Figure 6C:
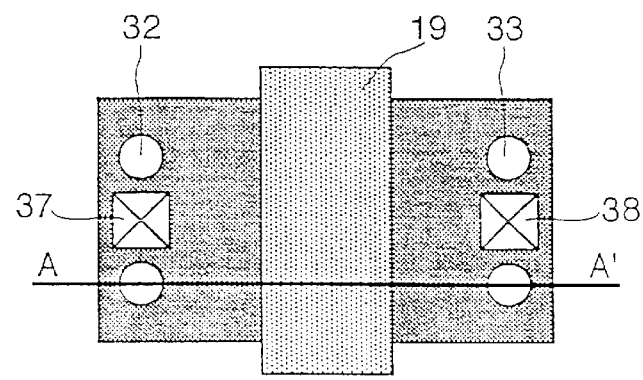

FIGS. 6a, 6b and 6c show another embodiment in which, starting from the structure shown in FIG. 3 (i.e., after the external passivation (silicon dioxide 24) has been done), at least one hole 32 is etched in the source region 22 and at least one hole 33 is etched in the drain region 23. The at least one hole 32 and at least one hole 33 are etched through the external passivation layer 24, the thin gate dielectric layer 18, the silicon layers 15, 17 and the silicon-germanium alloy layers of the combinations, at least as far as the silicon germanium alloy layer 14. The gate remains intact. Selective lateral etching via the holes 32 and 33 then eliminates the silicon-germanium alloy layers 14, 16 and forms tunnels 34 and 35. The silicon-germanium alloy layers 16 and 14 can be isotropic plasma etched or wet etched using an oxidizing solution. As in the case of the hole 25 in the gate 19, the walls of the tunnels 34, 35 are internally passivated with silicon dioxide 36 by thermal oxidation (FIG. 6). The tunnels 34 and 35 can equally be completely filled with silicon dioxide 36 or some other dielectric material.

FIG. 6c is a plan view of a device of the above kind in which four holes have been formed. Contacts 37, 38, providing access to the source and drain regions 22, 23, are also shown. To simplify the diagram, the external passivating layer (silicon dioxide 24), the insulative box 13, and the spacers 20, 21 are not shown.

The method described can be used to produce SON structures in which the tunnels are etched after forming the source and drain regions. The tunnels are therefore no longer subjected to high temperatures due to activation of the source and drain regions.

What is claimed is:

1. A method of fabricating a semiconductor device, comprising:
   forming a stack of layers on a main surface of a silicon substrate, the stack of layers including at least one combination of two layers, wherein the two layers comprise a bottom layer of germanium, or a bottom layer of germanium and silicon alloy, and a top layer of silicon;
   forming a thin gate dielectric layer and a gate on the top silicon layer of the at least one combination;
   forming source and drain regions along two opposite sides of the gate in the thin gate dielectric layer and in the stack;
   etching at least one hole in the stack at least as far as the bottom germanium layer, or the bottom germanium and silicon alloy layer, of the at least one combination after forming the source and drain regions; and
   selectively laterally etching at least a part of at least one germanium layer, or at least one germanium and silicon alloy layer, via the at least one hole to form at least one tunnel under the gate, wherein the at least one tunnel can be internally passivated or filled with a dielectric material.

2. The method of claim 1, further comprising etching the at least one hole by forming at least one vertical hole through the gate, the thin gate dielectric layer, and the stack under the gate as far as the bottom germanium layer, or the bottom germanium and silicon alloy layer, of the at least one combination.

3. The method of claim 1, further comprising etching at least two vertical holes through the source and drain regions as far as the germanium layer, or the germanium and silicon alloy layer, of the at least one combination.

4. The method of claim 1, further comprising forming the source and drain regions by implanting dopants that diffuse under a portion of the gate.

5. The method of claim 1, further comprising forming spacers on two opposite lateral sides of the gate after forming the gate.

6. The method of claim 5, further comprising controlling the selective lateral etching of the at least one germanium layer, or the at least one germanium and silicon alloy layer, via the at least one hole such that at least one tunnel extends under the spacers.

7. The method of claim 1, further comprising covering the semiconductor device with a layer of a passivating material before selectively laterally etching.

8. A method of fabricating a semiconductor device, comprising:

forming a stack of layers on a main surface of a silicon substrate, the stack of layers including more than one combination of two layers, wherein the two layers comprise a bottom layer of germanium, or a bottom layer of germanium and silicon alloy, and a top layer of silicon, and wherein a first combination is immediately adjacent the substrate and a final combination is farthest away from the substrate;

forming a thin gate dielectric layer and a gate on the top silicon layer of the final combination;

forming source and drain regions along two opposite sides of the gate in the thin gate dielectric layer and in the stack;

etching at least one hole in the stack at least as far as the bottom germanium layer, or the bottom germanium and silicon alloy layer, of the first combination after forming the source and drain regions; and selectively laterally etching at least a part of at least one germanium layer, or at least one germanium and silicon alloy layer, via the at least one hole to form at least one tunnel under the gate, wherein the at least one tunnel can be internally passivated or filled with a dielectric material.

9. The method of claim 8, further comprising etching the at least one hole by forming at least one vertical hole through the gate, the thin gate dielectric layer, and the stack under the gate as far as the bottom germanium layer, or the bottom germanium and silicon alloy layer, of the first combination.

10. The method of claim 8, further comprising etching at least two vertical holes through the source and drain regions as far as the germanium layer, or the germanium and silicon alloy layer, of the first combination.

11. The method of claim 8, further comprising forming the source and drain regions by implanting dopants that diffuse under a portion of the gate.

12. The method of claim 8, further comprising forming spacers on two opposite lateral sides of the gate after forming the gate.

13. The method of claim 12, further comprising controlling the selective lateral etching of the at least one germanium layer, or the at least one germanium and silicon alloy layer, via the at least one hole such that at least one tunnel extends under the spacers.

14. The method of claim 8, further comprising covering the semiconductor device with a layer of a passivating material before selectively laterally etching.

15. A method of fabricating a semiconductor device, comprising:

forming a stack of layers on a main surface of a silicon substrate, the stack of layers comprising more than one combination of two layers, wherein the two layers comprise a bottom layer of germanium and silicon and a top layer of silicon, and wherein a first combination is located immediately adjacent the substrate and a final combination is located farthest away from the substrate;

forming a thin gate dielectric layer on the top silicon layer of the final combination;

forming a gate on the top silicon layer of the final combination;

forming source and drain regions along two opposite sides of the gate;

etching at least one hole in the stack at least as far as the bottom germanium and silicon layer of the first combination after forming the source and drain regions; and selectively laterally etching at least a part of at least one germanium and silicon layer via the at least one hole to form at least one tunnel under the gate, wherein the at least one tunnel can be internally passivated or filled with a dielectric material.

16. The method of claim 15, further comprising etching the at least one hole by forming at least one vertical hole through the gate, the thin gate dielectric layer, and the stack as far as the bottom germanium and silicon layer of the first combination.

17. The method of claim 15, further comprising etching at least two vertical holes through the source and drain regions as far as the germanium and silicon layer of the first combination.

18. The method of claim 15, further comprising forming the source and drain regions by implanting dopants that diffuse under a portion of the gate.

19. The method of claim 15, further comprising forming spacers on two opposite lateral sides of the gate after forming the gate.

20. The method of claim 19, further comprising controlling the selective lateral etching of the at least one germanium and silicon layer via the at least one hole such that at least one tunnel extends under the spacers.

21. The method of claim 15, further comprising covering the semiconductor device with a layer of a passivating material before selectively laterally etching.

* * * * *